United States Patent [19]

Fujihira et al.

[11] Patent Number: 5,105,242
[45] Date of Patent: Apr. 14, 1992

[54] FIELD EFFECT TRANSISTOR HAVING SCHOTTKY CONTACT AND A HIGH FREQUENCY CHARACTERISTIC

[75] Inventors: Mitsuaki Fujihira; Masanori Nishiguchi, both of Yokohama, Japan

[73] Assignee: Sumitomo Electric Industries, Ltd., Osaka, Japan

[21] Appl. No.: 732,437

[22] Filed: Jul. 18, 1991

Related U.S. Application Data

[60] Continuation of Ser. No. 701,318, May 17, 1991, abandoned, which is a continuation of Ser. No. 507,520, Apr. 11, 1990, abandoned, which is a division of Ser. No. 230,367, Aug. 10, 1987, Pat. No. 4,981,809.

[30] Foreign Application Priority Data

Aug. 10, 1987 [JP] Japan ............... 62-199463
Aug. 27, 1987 [JP] Japan ............... 62-211382
Aug. 27, 1987 [JP] Japan ............... 62-211383

[51] Int. Cl.⁵ ............... H01L 29/48; H01L 29/80; H01L 29/06
[52] U.S. Cl. ............... 357/22; 357/15; 357/54; 357/55
[58] Field of Search ............... 357/22, 52, 54, 55, 357/15

[56] References Cited

U.S. PATENT DOCUMENTS

| | | | |
|---|---|---|---|
| 4,196,439 | 4/1980 | Niehaus et al. | 357/22 |
| 4,301,188 | 11/1981 | Niehaus | 357/67 |
| 4,426,656 | 1/1984 | DiLorenzo et al. | 357/22 |
| 4,811,077 | 3/1989 | Fowler et al. | 357/52 |
| 4,888,626 | 12/1989 | Davey | 357/55 |

FOREIGN PATENT DOCUMENTS 59-126676  7/1984  Japan ............... 357/22

OTHER PUBLICATIONS

M. Tubb, Australian Official Action dated Jan. 4, 1990.

Primary Examiner—J. Carroll
Attorney, Agent, or Firm—Cushman, Darby & Cushman

[57] ABSTRACT

A compound semiconductor device in which a source and drain regions are formed on both sides of a groove defined in a substrate and both regions are separated from the side walls of the groove by predetermined intervals through a first region with a depth shallower than the groove. A second region is formed between the source and drain region with a depth deeper than said groove. A gate electrode is formed on the surface of the second region in the groove for Schottky contacting with the upper surface of the second region. There is further disclosed a method of making a fine mask pattern suitable for making the compound semiconductor mentioned above.

2 Claims, 6 Drawing Sheets

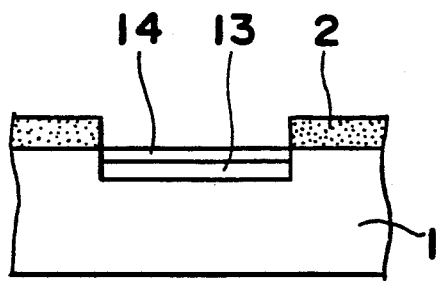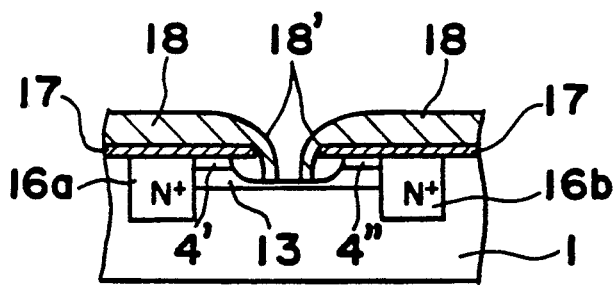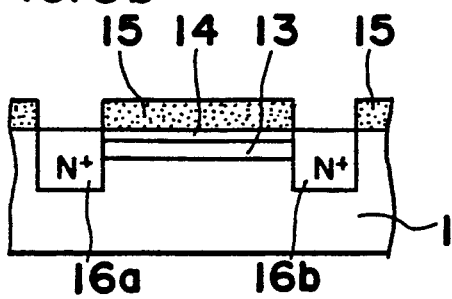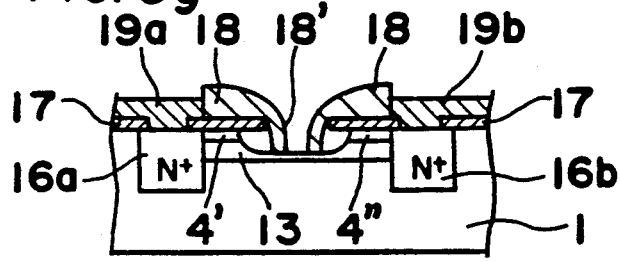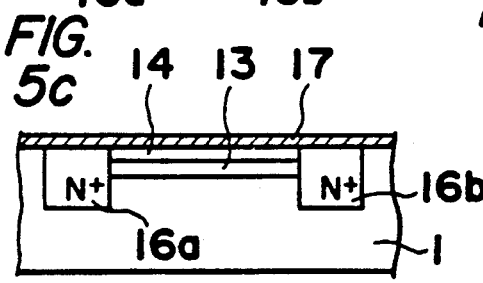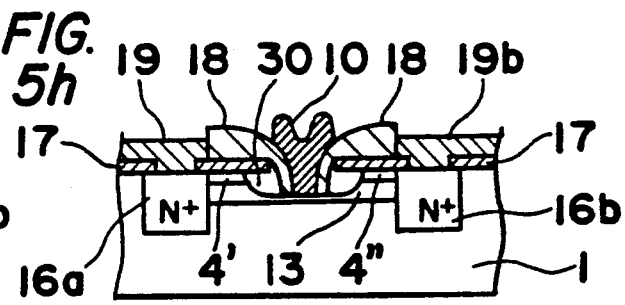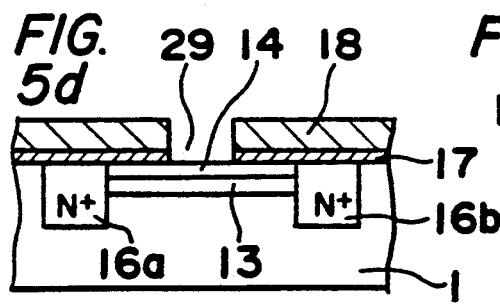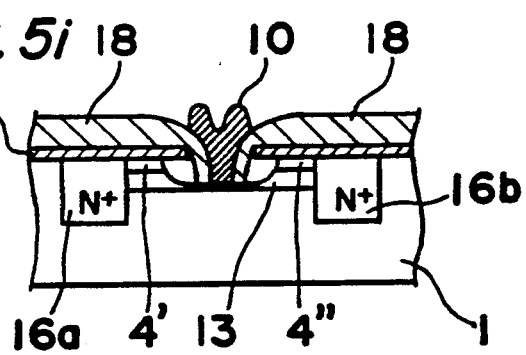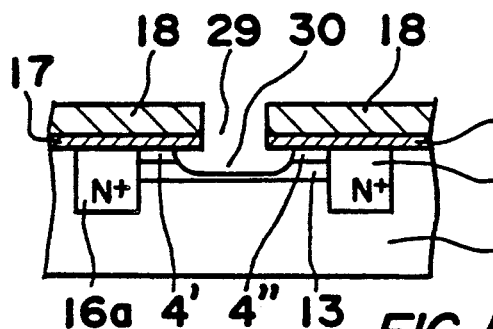

FIELD EFFECT TRANSISTOR HAVING SCHOTTKY CONTACT AND A HIGH FREQUENCY CHARACTERISTIC

This is a continuation of application Ser. No. 07/701,318, filed on May 17, 1991, abandoned, which was a continuation of 07/507,520, filed Apr. 11, 1990, abandoned which was a divisional of 07/230,367, filed Aug. 10, 1987, now U.S. Pat. No. 4,981,809.

BACKGROUND OF THE INVENTION

1. Field of the Invention

The present invention relates to a method for forming a mask pattern for use in making electrodes and circuits and ion implanting in manufacturing semiconductor devices. Also the present invention relates to a compound semiconductor device and to a method of the production thereof, particularly to a device in which a Schottky gate type field effect transistor or metal semiconductor field effect transistor (referred to as MESFET hereinafter) is used.

2. Description of the prior art

When a gate electrode, circuit or a region for implanting impurities are formed in an integrated circuit (IC), a mask pattern is previously made. In a process for manufacturing a MESFET of a recess gate type for example, there is formed an opening in a resist by a photo-lithographic method and metallic substance are deposited through the opening, whereby a gate electrode is formed (see page 80 in "Super high speed Compound Semiconductor Device" published by Baifukan). In this manner, according to the known technology, the gate electrodes of approximately 1.0 μm wide can be made.

However, in the prior art mentioned above, it is difficult to form fine circuit patterns finer than 1.0 μm in width due to the resolution of the optical system in the photo-lithography and to the developing precision of the photo resist layer. In order to realize the fine circuit patterns, the pattern manufacturing apparatus becomes complicated and expensive.

Besides the above, generally, a gallium arsenide (GaAs) field-effect transistor (referred to as "GaAs-MESFET" hereinafter) has a good property especially in a super-high frequency wave range, which is used in a small signal amplifier and oscillator. Also, it has been well known that a GaAs-MESFET has a very good property as a basic component of a super-high speed integrated circuit. There are various advantages such that, in a field-effect transistor (referred to as "FET" hereinafter), there can be obtained a high impedance compared to a bipolar transistor, and that the delay time due to the storage effect of the minority carriers is small because the FET is the majority carrier device, and that the relation between the input voltage and the output current generally represents a square characteristic and there occurs little noise, and that it can be integrated with high density because the component has a simple structure.

FIG. 1 shows the structure of a GaAs-MESFET generally used in the prior art. Ionized impurities such as Si+ are implanted into a main surface of a semi-insulating semiconductor substrate 1 by an ion implantation method so as to form a conductive semiconductor layer, so called an activated layer, furthermore in order to obtain an ohmic contact, ionized impurities with high density are implanted into the source electrode region 16a and drain electrode region 16b. Subsequently, the semiconductor substrate 1 is subjected to a thermal treatment and the implanted impurity ions are activated so as to obtain a desired resistance range. Subsequently, there are formed a source electrode 19a, drain electrode 19b and gate electrode 10 so as to accomplish the MESFET structure.

Generally, the high frequency characteristic of GaAs-MESFET is largely influenced by a mutual conductance $g_m$ and cut-off frequency $f_T$. The mutual conductance $g_m$ can be increased by shortening the length of the gate or by reducing the source resistance, and the increment of the mutual conductance $g_m$ results in that the current driving ability is increased so as to operate also a large capacitive load formed by circuit conductors, a capacity between the metal wires or the like when the FET is operated in high speed. And the cut-off frequency $f_T$ can be increased by increasing the mutual conductance $g_m$ or by reducing the capacity $C_{gs}$ between the gate and the source, and the larger the cut-off frequency $f_T$ is, the easier the operation in high frequency becomes. That is, in order to obtain a MESFET with good high frequency characteristics, it is necessary that the length of the gate is shortened and that the source and drain regions are brought in as close to the gate electrode as possible within the range that the capacity $C_{gs}$ between the gate and source is not increased due to the overlap of the gate electrode and the source region. Recently, from the view point mentioned above, there is adopted a refractory gate or dummy gate so that the FET is manufactured using so called self alignment technology for positioning the source and drain regions very close to the gate electrode, thereby obtaining a high performance.

However, as the length of the gate is shortened, there occurs such a problem, so called a short channel effect, that the threshold voltage of the GaAs-MESFET is shifted toward the negative polarity, the current cut-off ability is deteriorated and that the mutual conductance $g_m$ can not be increased beyond an expected value. The short channel effect remarkably occurs especially in the self alignment type FET in which the source and drain regions are proximate to the gate electrode. According to the inventor's consideration, this is mainly because of the leak of the current which flows through the semi-insulating substrate. Because of the occurrence of the short channel effect mentioned above, the capability of GaAs-MESFET is not as improved as expected and there has been a problem that the integration with high density of the GaAs-MESFET is prevented.

SUMMARY OF THE INVENTION

An object of the present invention is to provide a method for forming a fine mask pattern which can be obtained by a simple process.

In a method for forming a mask pattern according to the present invention, there is deposited mask materials on the surface of a semiconductor substrate and after defining an opening in the mask materials, the semiconductor substrate is heated so as to soften and fluidize the mask materials, so that the opening is made narrower.

According to the present invention, since the mask materials are softened by heating the semiconductor substrate so as to be fluidized toward the opening, the opening of the mask materials is made narrow, whereby it becomes possible to form a fine mask pattern.

A further object of the present invention is to provide a GaAs-MESFET with good high frequency characteristic and high reliability.

A further object of the present invention is to provide a GaAs-MESFET with the length of the gate is shortened eliminating the short channel effect even though the source and drain regions are formed proximate to the gate electrode.

A further object of the present invention is to provide a method of the production of a GaAs-MESFET with good yield.

In a compound semiconductor device according to the present invention, a source region and a drain region with a predetermined conductive type with high density are formed on both sides of a groove.

A first region including the impurities of the same conductive type with high density are formed in the substrate and between the side walls of the groove and the side edge portions of the source and drain regions. Also there are formed a second region including the impurities of the same conductive type with low density, formed between the source and drain regions in the depth of the substrate deeper than that of the groove and immediately under the bottom portions of the first regions so as to be in contact with the bottom portions of the first regions. Insulation layers are formed on the first regions so as to hang down into the groove. A gate electrode is provided in Schottky contact with the upper surface of the second region which is a middle part of the bottom of the groove exposed between the insulation layers.

In a method for producing the compound semiconductor device according to the present invention, in an impurity implanting step, there are implanted impurities of a predetermined conductive type with high density in the regions for forming a source and drain in a compound semiconductor substrate so as to form a source and drain regions, and there are implanted impurities of the same conductive type with high density in a shallow portion including a portion between the source and the drain regions so as to form a first region, and there are implanted impurities of the same conductive type with low density in the same region as the first region deeper than the first region and shallower than the source and drain regions so as to form a second region.

There is further provided an etching step, wherein there is formed a groove with an insulation layer as a mask and with a depth being deeper than that of the first region and shallower than that of the second region, in the middle portion between the source and drain regions, remaining a predetermined width of the first regions in both sides of the groove, one end portion of each first region being contact with the source or drain region.

In a heating step the compound semiconductor substrate with the insulation layer is heated so as to soften and fluidize the insulation layer to hang down from the upper portions of the first regions into the groove. A gate electrode is formed on the second region in Schottky contact with the upper surface of the second region in the bottom of the groove.

In the compound semiconductor device as described above, GaAs-MESFET comprises high density impurity regions to form a source and drain regions which are suitably offset from the gate electrode so that the source resistance $R_s$ and the capacity $C_{gs}$ between the gate and the source are reduced. Since the distance between the source and drain regions is added by the distance in the direction of the depth of the activated layer, the length of the channel is effectively made longer so that the snort channel effect seldom occurs. Moreover, the insulation layer such as SOG, polyimide, PSG and BPSG on the surface of the compound semiconductor substrate and on the insulation layer is refluidized so that the length of the gate can be reduced, whereby the mutual conductance $g_m$ is increased so as to improve the high frequency characteristic and the current driving ability. And a part of the activated layer is subjected to an etching treatment so as to be thinned, which also improves the mutual conductance $g_m$, resulting in that the density of the electric fields in the neighborhood of the drain edge region of the channel can be avoided.

BRIEF DESCRIPTION OF THE DRAWINGS

FIGS. 5(a) to 5(h) are sectional views each showing a main step according to a method for producing the MESFET of the example 1 shown in FIG. 4(a), FIGS. 6(a) to 6(e) are sectional views each showing a main step according to a method for producing the GaAs-MESFET of the example 2 shown in FIG. 4(b), and FIGS. 7(a) to 7(f) are respectively showing the steps of the production of a further embodiment of the FET according to the present invention.

DETAILED DESCRIPTION OF THE PREFERRED EMBODIMENTS

Figure 1:
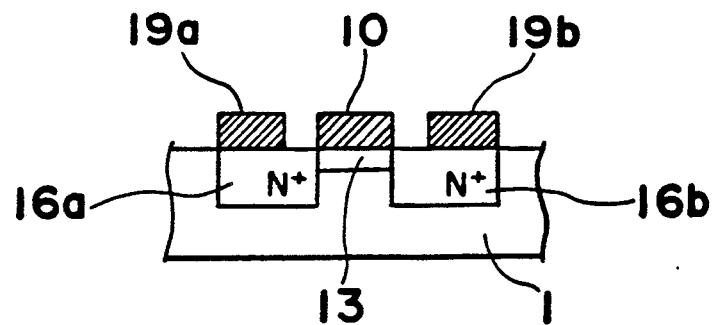
FIG. 1 is a sectional view of GaAs-MESFET which is most generally used in the prior art.

Examples of according to the present invention are explained with reference to the attached drawings in which like parts are designated by the same reference numerals and the redundant explanation are omitted.

Figure 2A:
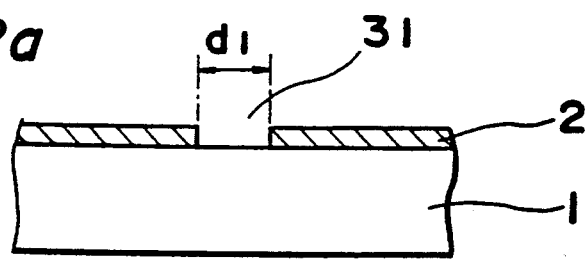
FIGS. 2(a) to 2(f) are sectional views showing respective processes of an embodiment of making a mask pattern for a LSI according to the present invention, FIG. 3(a) to 3(e2) are sectional views showing respective processes of a further embodiment of making the mask pattern according to the present invention.
Figure 2B:
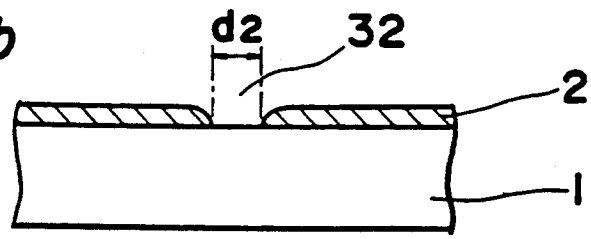
Figure 2C:
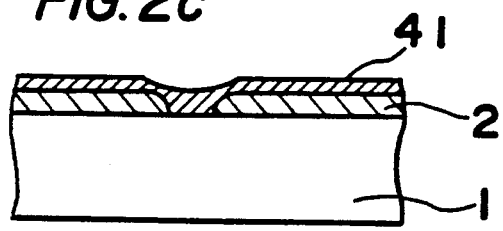
Figure 2D:
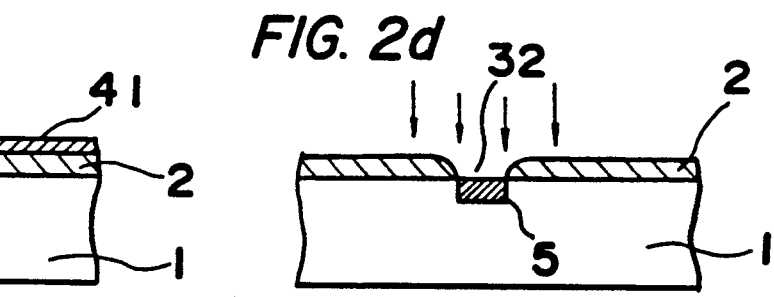
Figure 2E:
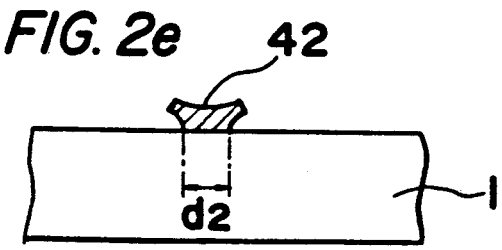
Figure 2F:
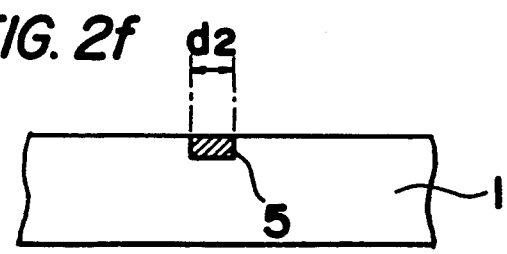

FIGS. 2(a) to 2(f) are sectional views showing processes of the first example of making the circuit pattern on a semiconductor substrate according to the present invention. In the process of the first example, there is formed a known mask pattern by a known photo-lithographic method. Specifically, there is prepared a semiconductor substrate 1 made of compound semi insulating material such as GaAs. A mask layer 2 made of mask materials 2 is formed on the surface of the substrate 1. As the material of the mask layer 2, there may be used polyimide, for example, which can be softened and fluidized at a temperature of 500° to 600° C. The entire surface of the mask layer 2 is coated with photo resist (not shown) by a spin coating method. Subsequently the substrate with the photo resist is subjected an exposure and developing process and in turn the mask layer 2 is etched and unnecessary photo resist is removed by chemical agents, whereby there is formed an opening 31 of $d_1$ in width in the mask layer 2 as shown in FIG. 2(a).

Next, the substrate 1 with the mask layer 2 is heated. The heating process mentioned above is performed at such temperature that the material of the mask layer 2 is softened and fluidized to some degree and when polyimide is used as the mask layer 2, the heating temperature mentioned above is 500° to 600° C. Moreover, when PSG of phosphorus group, BPSG or SOG of boron/phosphorus group is used as the mask materials 2, the substrate 1 is heated at a temperature corresponding to the respective materials. Thus, the edge portions of the mask layer 2 near both sides of the opening 31 fall down in the opening 31 leaving opening 32 of width $d_2$ which is narrower than $d_1$. The narrower opening is designated by the reference numeral 32 in FIG. 2(b), therefore the finer mask pattern and circuit pattern can be obtained. In one example, after forming a mask pattern with the opening 31 of 1.0 $\mu$m wide, the substrate 1 with the mask layer 2 is subjected to the process of the present invention as mentioned above, a mask pattern with the opening 32 of approximately 0.6 $\mu$m wide can be easily obtained.

Subsequently, a process such as forming an electrode or ion implantation is performed. In case of forming an electrode, for example, as shown in FIG. 2(c1), metal materials are coated on the whole part of the surface of the mask layer 2 and then the lift-off process is performed by removing the mask layer 2, so that an electrode 2 can be formed in the opening 32 as shown in FIG. 2 (d1). The width of the electrode 42 is equal to the width $d_2$ as mentioned above, which is narrower than the first width $d_1$. On the other hand, in case of ion implantation, ionized impurities are implanted through the opening 32 as shown in FIG. 2(c2). Subsequently, the mask layer 2 is removed so as to form a region 5 for implanting impurities of $d_2$ wide.

A further embodiment according to the present invention will be explained.

Figure 3A:
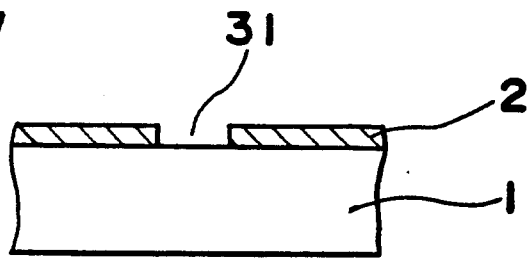
Figure 3B:
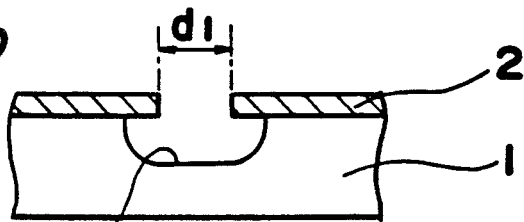
Figure 3C:
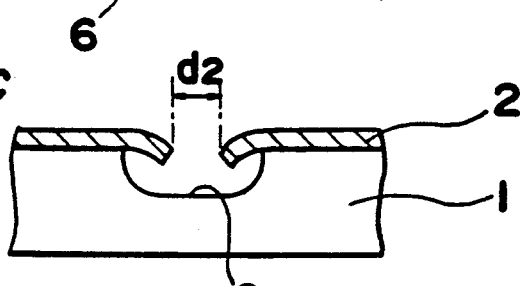
Figure 3D:
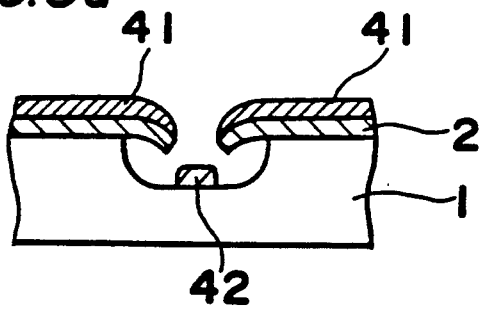
Figure 3E:
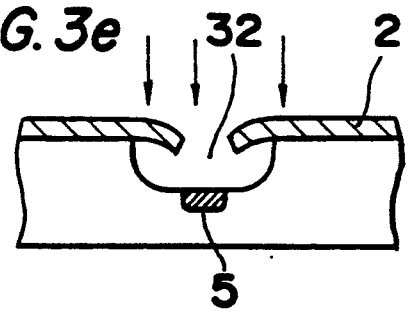
Figure 3F:
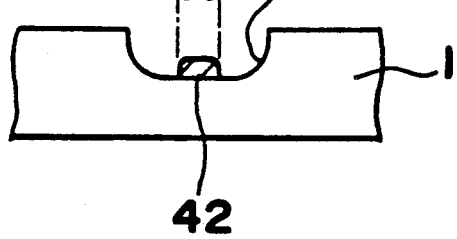
Figure 3G:
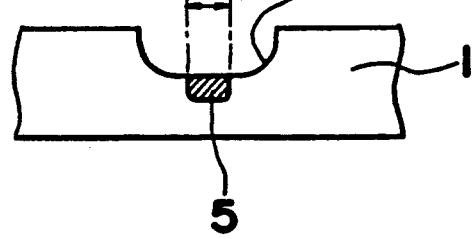

FIGS. 3(a) to 3(e2) are sectional views of a wafer substrate each showing a process of the second embodiment. First, the substrate 1 with the mask layer 2 with the opening 31 of the width $dl$ as shown in FIG. 3(a) is formed by similar process as in FIG. 2(a) as mentioned above. Subsequently, an isotropic etching process of the substrate 1 is performed through the opening 31 so as to form a concavity 6 in the substrate 1 corresponding to the portion below the opening 31.

Next, as a process peculiar to the present invention, the mask layer 2 is softened and fluidized by heating the substrate 1. As the result, mask layer 2 in both peripheral portions facing to the opening 31 hangs down into the concavity 6 so that the width of the opening 32 is changed from $d_1$ to $d_2$ ($d_2 < d_1$).

Subsequently, the process of forming an electrode or ion implantation is performed. For example, as shown in FIG. 3(d1), when metal material 41 is coated on the whole surface of the mask layer 2, the metal material is dropped in the concavity 6 through the opening 32 and deposited on the bottom of the concavity 6 to form a metal electrode 42. The width of the electrode 42 in the concavity 6 becomes $d_2$. And the mask layer 2 is removed and the metal materials 41 is lifted off, thereby obtaining a structure as shown in FIG. 3(e1) in which the metal electrode 42 is situated on the substrate 1 in the concavity 6 with the width d2 narrower than d1. On the other hand, in case of ion implantation, the ionized impurities are implanted on the substrate 1 in the bottom of the concave 6 through the opening 32 as shown in FIG. 3(d2). Upon removing the mask layer 2, there is formed the ion implanted region 5 of $d_2$ wide in the concave 6 as shown in FIG. 3(e2).

It is obvious to those skilled in the art that the present invention is not limited to the above mentioned examples and that various modifications may be made.

For example, the present invention is not limited to a mask pattern for forming an electrode and for ion implantation but it may be applied to various mask patterns for forming circuit patterns. Moreover, also any materials of the mask pattern except the materials mentioned above may be used so long as the materials has no influence on the substrate.

As described above in detail, according to the present invention, upon heating the semiconductor substrate, the mask materials is softened and fluidized toward the opening, therefore, there is an effect that a fine mask pattern can be obtained through a simple process.

An embodiment of the compound semiconductor device according to the present invention will be explained with respect to FIGS. 4(a) and 4(b).

Figure 4A:
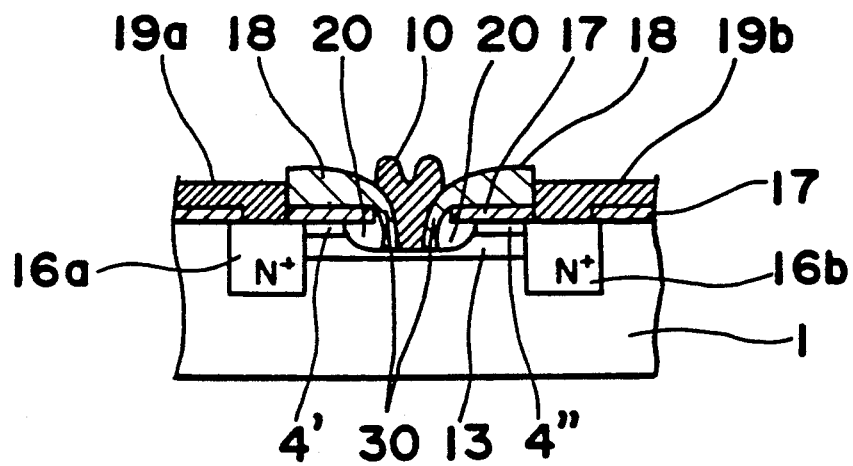
FIGS. 4(a) and 4(b) are sectional views each showing a structure of GaAs-MESFET of the examples 1 and 2 according to the present invention.
Figure 4B:
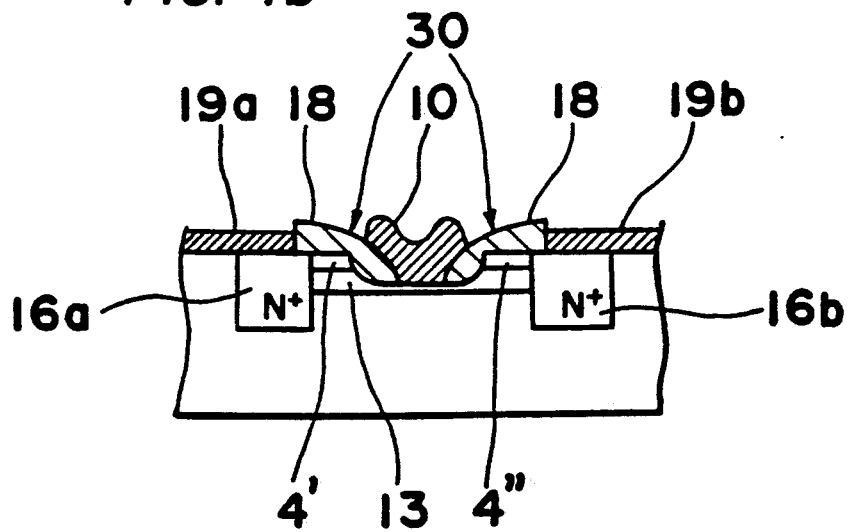

Referring to FIGS. 4(a) and 4(b), there are implanted impurities such as silicon Si with a high density in the regions for forming a source and drain in the semi-insulation GaAs substrate 1 so as to form a source and drain regions 16a and 16b of N+ type. There is formed a groove 20 of a predetermined depth in the intermediate portion between the source and drain regions 16a and 16b, and there are formed first regions 4' and 4" of N+ type including silicon of a high density between both side walls of the groove 20 and the side edge portions of the source and drain regions 16a and 16b, and there is formed a second region 13 of N type immediately below the first regions 4' and 4" and the bottom of the groove 20. There are provided electrodes 19a and 19b on the source and drain regions 16a and 16b of N+ type. The bottoms of the first regions 4' and 4" are shallower than the bottom of the groove 20. The electrodes 19a and 19b contact with the source regions 16a and 16b in a ohmic contact. There is provided a gate electrode 10 on the bottom surface of the groove 20 in Schottky contact with the surface of the second region 13.

The embodiment is characterized in that the insulation layers 30 on the first regions 4' and 4" are hung down into the groove 20. That is to say, in the example shown in FIG. 4(a), the insulation layers 18 are formed of lower protecting films 17 and upper reflowable insulation layers 18, wherein the lower protecting films 17 is projected above the groove 20 and the upper insulation layers 18 are hung down from the edge portions of the protecting films 17 into the groove 20 so as to contact onto the second region 13. On the other hand, in the example shown in FIG. 4(b), the insulation layers 30 is formed of only the reflowable insulation layer 18, which hang down into the groove 20 so as to contact onto the second region 13. As the material of the reflowable insulation layer 18 there may be used such as Spin On Glass (abbreviated as SOG), polyimide, Phoshorus-Doped Silica Glass (abbreviated as PSG) or Boron-Phoshorus-Doped Silica Glass (abbreviated as BPSG) but the material is not limited to the above mentioned materials.

According to the structures as shown in FIGS. 4(a) and 4(b), the gate electrode 10 is offset from the source and drain regions 16a and 16b by the first regions 4' and 4"]of N+ type, the groove 20 and the insulation layers 18. Therefore, the capacity $C_{gs}$ between the gate 10 and the source region 16a or 16b and the source resistance $R_s$ can be decreased so as to improve the high frequency characteristic of the MESFET In addition, since the change of the density of the impurities between the first regions 4' and 4" and the second region 13 becomes moderate, the density of the electric fields of the interface between the first regions and the second region can be avoided so as to inhibit an inferior operation due to the generation of hot carriers. Also, since the length of the channel becomes effectively longer as much as the length from the interface between the first regions 4' and 4" and the second region 13 to the bottom edge portion of the gate electrode 10, the short channel effect can be prevented and the activating threshold value of the MESFET can be stabilized. Moreover, since the second region, i.e. the activated layer 13 can be made thin by forming the groove 20, the mutual conductance gm can be made large.

Next, the processes for producing the MESFET of the example shown in FIG. 4(a) are explained with reference to FIGS. 5(a) to 5(h).

As shown in FIG. 5(a), there is formed a resist pattern 2 on a semi-insulation GaAs substrate 1 by a usual impurities such as $Si^+$ is implanted into the region of the exposed GaAs substrate 1 by a selecting ion implantation method so as to form a region of an activated layer 13. Subsequently, with the same resist pattern 2 as a selection mask, there are implanted ionized impurities with high density with lower acceleration energy compared to that in forming the activated layer 13 so as to form an impurity layer 14 with high density.

Next, as shown in FIG. 5(b), the resist pattern 2 is removed so as to form a resist pattern 15. Subsequently, ionized substance to be impurities is selectively implanted in the substrate 1 with accelerating energy larger than that in forming the activating layer 13 and high density impurity layer 14 so as to form the high density regions 16a and 16b.

As shown in FIG. 5(c), after removing the resist pattern 15, there is coated on the surface of the substrate 1 a protection layer 17 made of SiN or $SiO_2$ by a plasma chemical vapor deposition (referred to as plasma CVD hereinafter) method. Subsequently, upon annealing the substrate 1 at a temperature of 800° C. for ten minutes in an atmosphere of $N_2$ gas for example, the ionized impurities implanted in said process are activated so as to fulfill the peculiar functions of the activating layer 13, high density impurity layer 14 and high density impurity regions 16a and 16b respectively.

Next, as shown in FIG. 5(d), there is formed an insulation layer 18 using such as SOG, polyimide, PSG and PBSG reflowable at a relatively low temperature, lower than 800° C. by a plasma CVD method and a spin coating method so as to define an opening 29 in a portion for forming a gate electrode by a usual photo-lithographic method. Subsequently, as shown in FIG. 5(e), the intermediate portions of the activating layer 13 and a part of the high density impurity layer 14 on the GaAs substrate 1 are etched by a reactive ion etching or wet etching, whereby the first regions 4' and 4" are formed on both sides of the groove 30.

Further, as shown in FIG. 5(f), the insulation layer 18 is refluidized at a relatively low temperature such as lower than 800° C. in an atmosphere of As gas for a short time so as to form a pattern 18' for forming a gate electrode.

Subsequently, as shown in FIG. 5(g1), the parts of the insulation layer 18 and the protection film 17 on the high density impurity regions 16a and 16b respectively are etched so as to define openings and in turn a resist layer (not shown) is coated, subsequently metals for ohmic electrodes such as AuGe and Ni are evaporated or deposited on the impurity regions 16a and 16b for forming a source and drain electrodes 19a and 19b. Subsequently, the metals for the ohmic electrodes in the unnecessary regions are removed by a lift-off method which is known in the prior art, whereby the source and drain electrodes 19a and 19b are formed and metalized.

Subsequently, as shown in FIG. 5(h), there is formed a resist pattern (not shown) for forming a gate electrode by a usual photo-lithographic method so as to evaporate or deposit metal such as Ti and Pt or Au for the Schottky electrode to form a gate electrode 10 by a lift-off method. Thus, the main portion of the example shown in FIG. 4(a) of the GaAs-MESFET according to the method of the present invention can be made.

The processes shown in FIGS. 5(g1) and 5(h) may be performed in a different manner as follows. First, after performing the processes shown by the figures up to FIG. 5(f), there is evaporated or deposited a Schottky electrode metal by which the gate electrode 10 is formed by a usual photo-lithographic method as shown in FIG. 5(g2) so as to form a gate electrode 10 by a lift-off method. Subsequently, as shown in FIG. 5(h), the metals for ohmic electrodes, i.e., the source and drain electrodes 19a and 19b are evaporated or deposited by a normal photo-lithography and the metals for ohmic electrode in the unnecessary regions on the impurity regions 16a and 16b are removed by a lift-off method so as to form the source and drain electrodes 19a and 19b to be alloyed. Thus, the main portion of the GaAs-MESFET of the example 1 according to the method of the present invention can be made.

Next, the processes for producing a semiconductor device of the example shown in FIG. 4(b) will be explained with reference to FIG. 6.

Figure 6A:
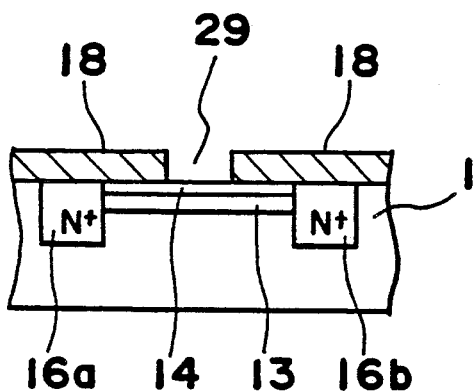

FIGS. 6(a) to 6(f) show one example of the process for producing the GaAs-MESFET of the example shown in FIG. 4(b) according to the present invention. It is noted that the processes up to FIG. 6(a) are similar to those shown in FIGS. 5(a) to 5(c).

In other words, after performing the processes up to FIG. 5(c), the protection film 17 is removed by etching and the reflowable insulation layer 18 is formed by a plasma CVD method or spin coating method so that there is defined an opening 29 in the portion for forming a gate electrode by a normal photo-lithography as shown in FIG. 6(a).

Figure 6B:
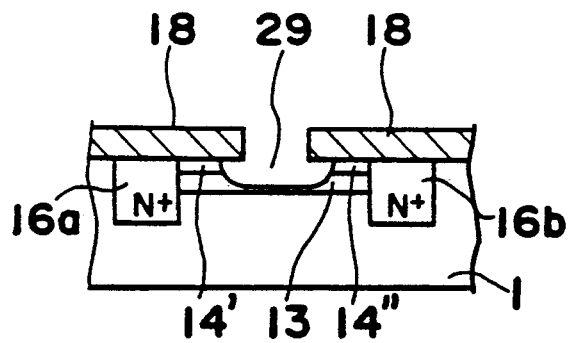

Subsequently, as shown in FIG. 6(b), the middle parts of the working layer 13 and the high density impurity layer 14 on the GaAs substrate 1 are processed by reactant type ion etching or wet etching.

Figure 6C:
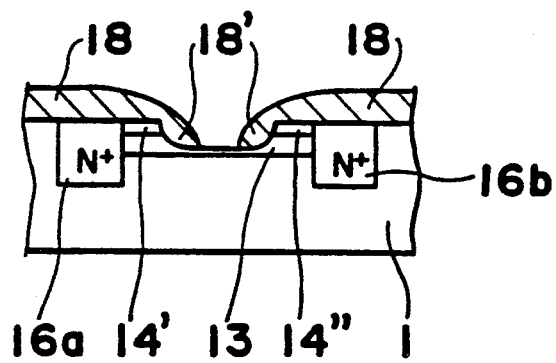
Figure 6D:
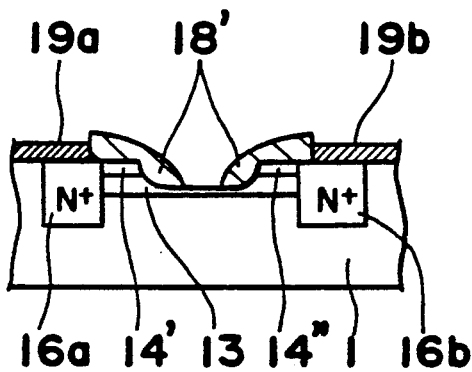

Subsequently, as shown in FIG. 6(c), the insulation layer 18 is refluidized in an AS gas atmosphere at a relatively low temperature e.g., lower than 800° C. for a short time so as to form patterns 18' for forming the gate electrode. Subsequently, as shown in FIG. 6(d), the parts of the insulation layer 18 on the high density impurity regions 16a and 16b are etched to define an opening so as to form a resist pattern (not shown), subsequently, the ohmic electrode metals are evaporated or deposited to form the source and drain electrodes 19a and 19b. Subsequently, the ohmic electrode metals of the unnecessary regions are removed by a lift-off method and the source and drain electrodes 19a and 19b are metallized.

Figure 6E:
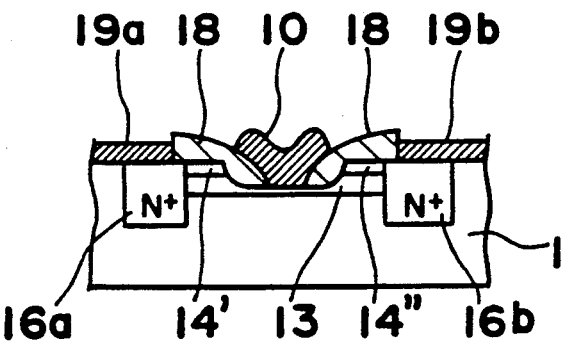

Subsequently, as shown in FIG. 6(e), there is formed a resist pattern (not shown) for forming the gate electrode by a normal photo-lithography so as to evaporate or deposit the Schottky electrode metals for forming the gate electrode 10, thereby forming the gate electrode 10 by a lift-off method. Thus, the main portion of the GaAs-MESFET of the example shown in FIG. 4(b) according to the method of the present invention can be made.

Moreover, in the example shown in FIGS. 6(a) to 6(e) similarly to the example shown in FIG. 4(a), it is also possible to form the gate electrode 10 before forming the source and drain electrodes 19a and 19b.

The present invention is not limited to the examples mentioned above but various kinds of modifications can be made.

For example, as to the compound semiconductor substrate, the material thereof is not limited to GaAs but InP (indium phosphorus) may be also used. Moreover, as the materials of the reflowable insulation layer and protection film, various kinds of materials may be used in addition to the materials as described above.

As described above in detail, in the MESFET of the compound semiconductor device according to the present invention, the high density impurity regions which become a source and drain regions are suitably offset from the gate electrode so that the source resistance $R_s$ and the capacity $C_{gs}$ between the gate and the source can be reduced. Since the distance between the source and the drain regions is added by the distance along the depth of the activated layer, the length of the channel is effectively made long so that there seldom occurs a short channel effect. Furthermore, the insulation layer such as SOG, polyimide, PSG and BPSG on the surface of the substrate or protection film of the compound semiconductor can be refluidized so as to reduce the length of the gate, so that the mutual conductance gm can be increased and the high frequency characteristic and current activating ability can be improved. In addition, since a part of the activated layer is thinned by etching, whereby the mutual conductance $g_m$ is also improved and furthermore, the density of the electric fields at the end portion of the drain of the channel can be avoided.

Furthermore, according to the method for producing the compound semiconductor device of the present invention, it becomes hard for the short channel effect to occur, therefore, the MESFET of the compound semiconductor can be manufactured with good high frequency characteristic, high reliability and good yield.

The GaAs-MESFET has a good high frequency characteristic and high speed operability, which is considered to be important as a small signal amplifier and high speed switching element operating in a high frequency.

In case of forming a normal MESFET, there are formed source and drain regions of N+ type on a semi-insulation substrate for example, wherein there is formed a activation layer between the source and the drain regions and there is formed a Schottky electrode on the N type activation layer so as to form a normal MESFET. By the way, in case of forming a GaAs-MESFET, since it may be expected that the capability of the GaAs-MESFET can be improved by shortening the length of the gate, there are provided various kinds of devices for shortening the length of the gate.

A further embodiment of the MESFET according to the present invention is explained with reference to FIGS. 7(a) to FIG. 7(f).

Figure 7A:
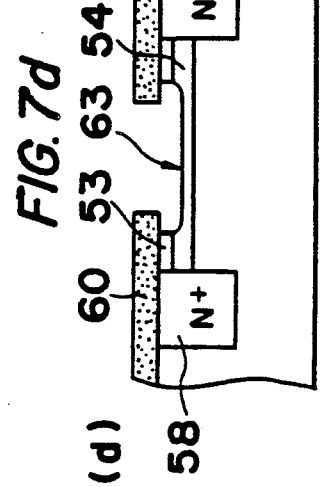

As shown in FIG. 7(a), first, there is prepared a GaAs substrate 1 so as to form a mask 51 with an opening 52 in a region for forming a GaAs-MESFET by a known photo-lithographic method. Subsequently, there are formed first and second regions 53 and 54 on the surface of the substrate 1 corresponding to the opening 52 of the mask 51 by implanting ionized silicon therein. The first region 53 is made as N+ type semiconductor by implanting the ionized silicon with high density and the second region 54 is made as N type semiconductor by implanting the ionized silicon with low density immediately under the first region 53. The thickness of the second region 54 is made generally 0.1 μm.

Figure 7B:
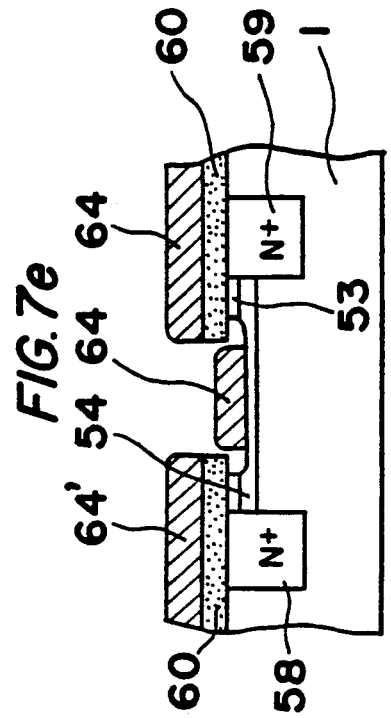

Next, after the mask 51 is removed by chemical agents such as acetone, there is formed a mask 55 again by a photo-lithographic method. Subsequently, the ionized silicon with high density is deeply implanted in the source and drain regions 58 and 59 through the openings 56 defined in the mask 55 so as to form source and drain regions. The source and drain regions 58 and 59 are formed so as to assure a good contact with electrodes to be formed later as shown in FIG. 7(b).

Figure 7C:
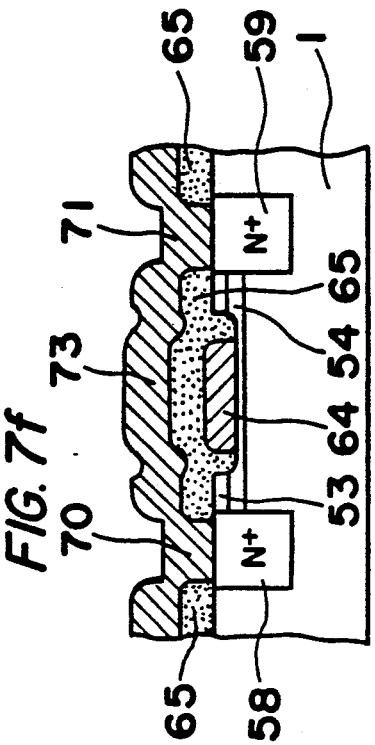
Figure 7D:
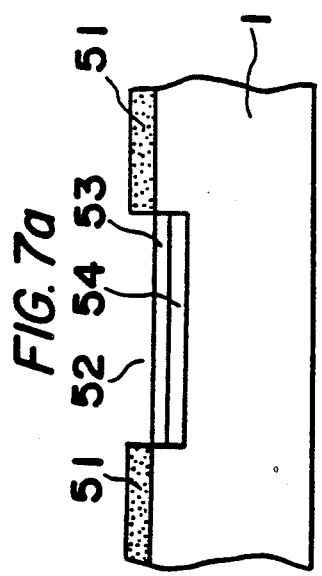

Subsequently, the mask 55 is removed again and there is formed a mask 60 in a manner similar to the manner of forming the mask 55. The mask 60 has an opening 61 corresponding to the region for forming a gate electrode as shown in FIG. 7(c). The middle portions of the first and second regions 53 and 54 between the source and drain regions 58 and 59 are subjected to an isotropic etching through the opening 61 of the mask 60 so as to form a groove 63 as shown in FIG. 7(d). The depth of the groove 63 is deeper than that of the first region 53 and shallower than that of the second region 54, the thickness of the remaining second region 54 being generally 0.05 μm.

Figure 7E:
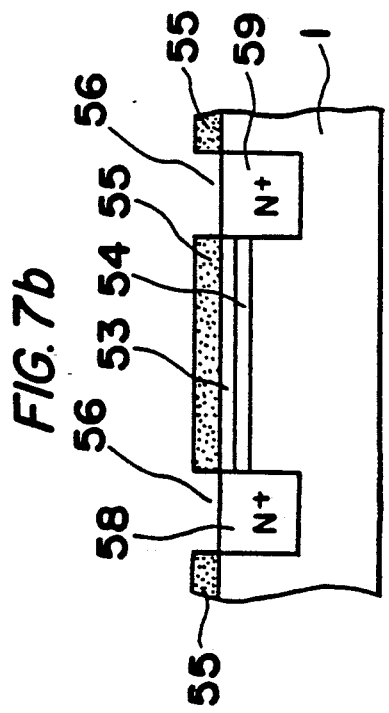

Subsequently, there are deposited metal layers 64 and 64' on the mask 60 by a method such as vacuum evaporation method as shown in FIG. 7(e). When the mask 60 is removed by chemical agents such as acetone, the unnecessary metal portions 64' are removed leaving the metal portion 64, which becomes a gate electrode. The gate electrode 64 is made by sequentially depositing titanium (Ti), platinum (Pt) and aurum (Au) in layers forming Schottky contact with the bottom of the groove 63 i.e., the surface of the second region 64 in the groove.

Figure 7F:
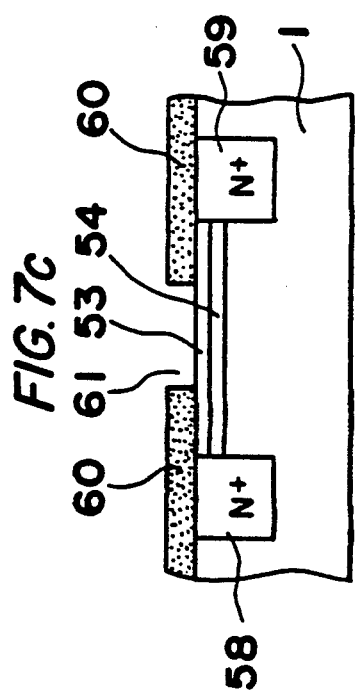

Subsequently, there is formed a mask 65 again by a photo-lithographic method and ohmic electrode materials 70, 71 and 73 are formed by deposition as shown in FIG. 7(f) and the mask portions 65 with the unnecessary metal portions thereon are removed by a known lift-off method, thereby obtaining a MESFET. The ohmic electrode materials 70, 71 and 73 are made of alloy of aurum and germanium (Ge) for example.

As to the processes for producing a MESFET mentioned above, various kinds of variations may be adopted.

For example, the order of the processes shown in FIGS. 7(a) and 7(b) may be reversed, in other words, the ohmic electrodes 70 and 71 may be formed after forming the source and drain regions 58 and 59. Moreover, as the method for forming the mask and the electrode materials, any other method and material may be adopted so long as the above mentioned processes can be performed.

As described above in detail, according to the present invention, since the first and second regions are formed between the side edge portions of the source and drain regions and the side walls of the groove, the length of the channel can be effectively increased. Moreover, since the gate electrode on the bottom of the groove can be preferably offset from the source and drain regions by the first and second regions, the capacity $C_{gs}$ between the gate and the source and the source resistance can be reduced. Thus, there can be obtained a MESFET having an effect of improving a high speed operability and high frequency characteristic and preventing the occurrence of the short channel effect.

It is noted that in making the electrode 10 as shown in FIGS. 4(a) and 4(b) or FIGS. 5(h), FIG. 6(e) and FIG. 7(e), in case where the opening of the mask layer must be fine, the method shown in FIGS. 2 and 3 may be effectively used.

What is claimed is:

1. A compound semiconductor device comprising:
   a compound semiconductor substrate;
   a groove formed on said substrate, said groove having two side portions being defined by side walls with a predetermined depth and a bottom;
   a source region and a drain region formed in said substrate on both sides of said groove separated from said side walls by predetermined intervals, said source and drain regions having a first depth;
   first regions including impurities of the same conductive type as found in the source and drain regions with high density, each of said first regions being formed in the substrate between said side walls and said source and drain regions with a depth shallower than said groove;
   a second region including impurities of the same conductive type with low density, formed in said substrate between the source and drain regions with a second depth deeper than said groove and less than said first depth, a pair of said second region forming the bottom of said groove and immediately under bottom surfaces of the first regions so as to contact with the bottom surfaces of the first regions, said second region being formed by one of an epitaxial layer and an ion implanted layer;
   insulation layers formed on upper surfaces of said first regions to hang down into said groove with free ends of said insulation layers contacting the bottom of said groove and thereby forming a cavity between the insulation layers hanging into the groove and the side walls of the groove;
   a source electrode and a drain electrode formed on top of the source and drain regions respectively, and each of said source and drain electrodes contacting one of the insulation layers; and
   a gate electrode formed on a surface of the second region in said groove for making Schottky contact with an upper surface of the second region.

2. The compound semiconductor device according to claim 1, wherein said insulation layers comprise lower layers projected from upper surfaces of the source and drain regions toward said groove and upper layers hung down from the upper surfaces of the lower layers into said groove.

* * * * *